United States Patent [19]

Lee

[11] Patent Number: 5,675,158
[45] Date of Patent: Oct. 7, 1997

[54] LINEAR SOLID STATE IMAGING DEVICE WITH TRAPIZOID TYPE PHOTODIODES

[75] Inventor: Kyung Soo Lee, Kwachen-si, Rep. of Korea

[73] Assignee: LG Semicon Co., Ltd., Chungcheongbuk-do, Rep. of Korea

[21] Appl. No.: 456,619

[22] Filed: Jun. 1, 1995

Related U.S. Application Data

[63] Continuation of Ser. No. 214,960, Mar. 17, 1994, abandoned.

[30] Foreign Application Priority Data

Feb. 23, 1994 [KR] Rep. of Korea ............... 3199/1994

[51] Int. Cl.$^6$ .................. H01L 27/148; H01L 29/68
[52] U.S. Cl. .................. 257/233; 257/222; 257/230; 257/232; 257/234
[58] Field of Search .................. 257/222, 223, 257/230, 232–234, 240, 241

[56] References Cited

U.S. PATENT DOCUMENTS

| | | |
|---|---|---|
| 3,983,573 | 9/1976 | Ishihara ................. 257/234 |
| 4,471,387 | 9/1984 | Nadler ................. 257/234 |
| 4,527,182 | 7/1985 | Ishihara et al. ............ 257/223 |
| 4,839,911 | 6/1989 | Boucharlet ............... 257/240 |
| 5,175,602 | 12/1992 | Nam ................. 257/240 |
| 5,196,719 | 3/1993 | Miwada ................. 257/233 |
| 5,235,196 | 8/1993 | Anagnostopoulos et al. ....... 257/234 |
| 5,365,093 | 11/1994 | Kuno ................. 257/240 |

Primary Examiner—Wael Fahmy
Assistant Examiner—Fetsum Abraham
Attorney, Agent, or Firm—Morgan, Lewis and Bockius, LLP

[57] ABSTRACT

A linear solid state imaging device including a substrate (21), a first well (22) of a predetermined junction depth, a second well (23) of a deeper junction than the first well (22), a trapezoid type photodiode area (24) linearly arranged in the first well (22) in which except for one side of the parallel sides of the trapezoid area, the other sides are surrounded by a channel stop area (31), a pair of HCCD areas (25) in the second well in areas of both sides of the photodiode (24) and connected to the output amplifier, a shift gate (28) formed in the substrate between the areas for the photodiode (24) and the HCCD and for transferring the accumulated charges in the photodiode area to the HCCD area, a shift gate channel area (26) formed, in the first well underneath the shift gate (28) and having a six-sided shape one side of which is in contact with the photodiode area (24), another side of which has a V-shaped depression and the other sides are surrounded by a channel stop area (31), a potential barrier formation area (27) formed near the top surface of the photodiode area, a poly gate (29) disposed over the substrate in which HCCD area is formed to output the transferred charges from the photodiode to the output amplifier, an insulating layer (30) formed between the shift gate and the poly gate, and the channel stop area isolates the photodiode cells from each other by means of a potential barrier.

12 Claims, 7 Drawing Sheets

FIG.2 prior art
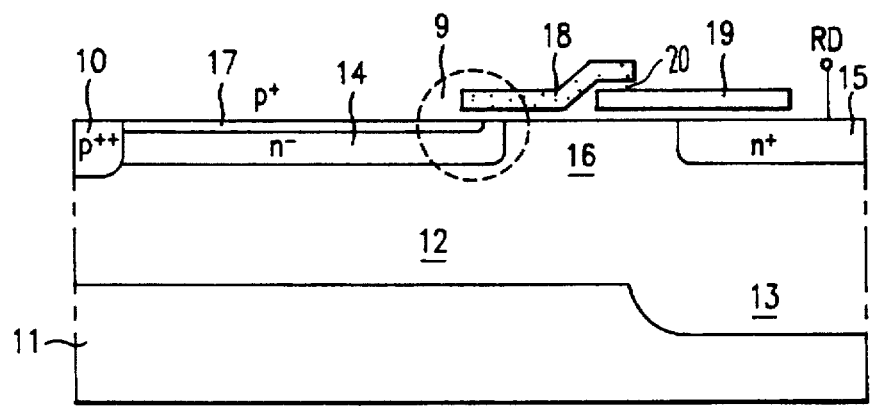
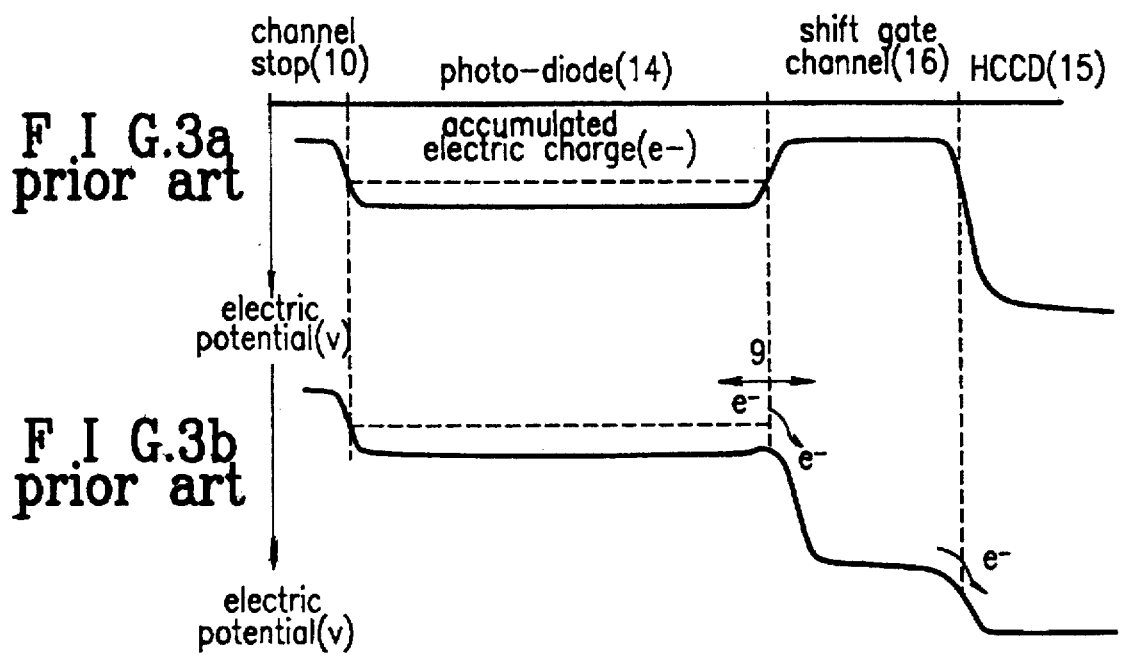
FIG.3a prior art
FIG.3b prior art

Conventional FAX CCD

FIG.6
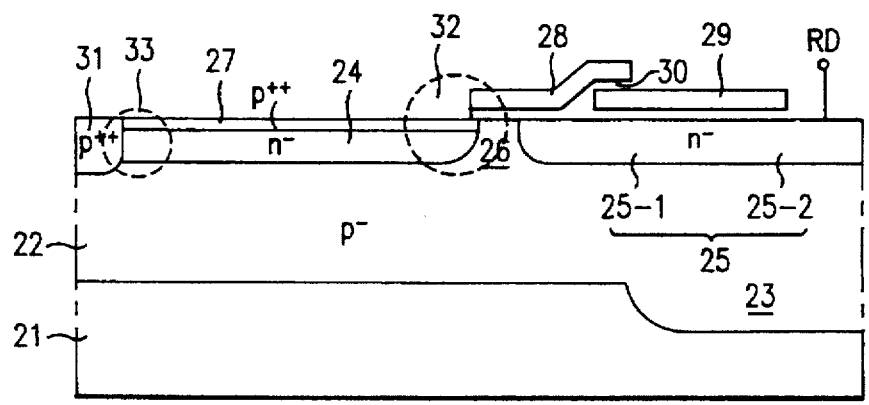
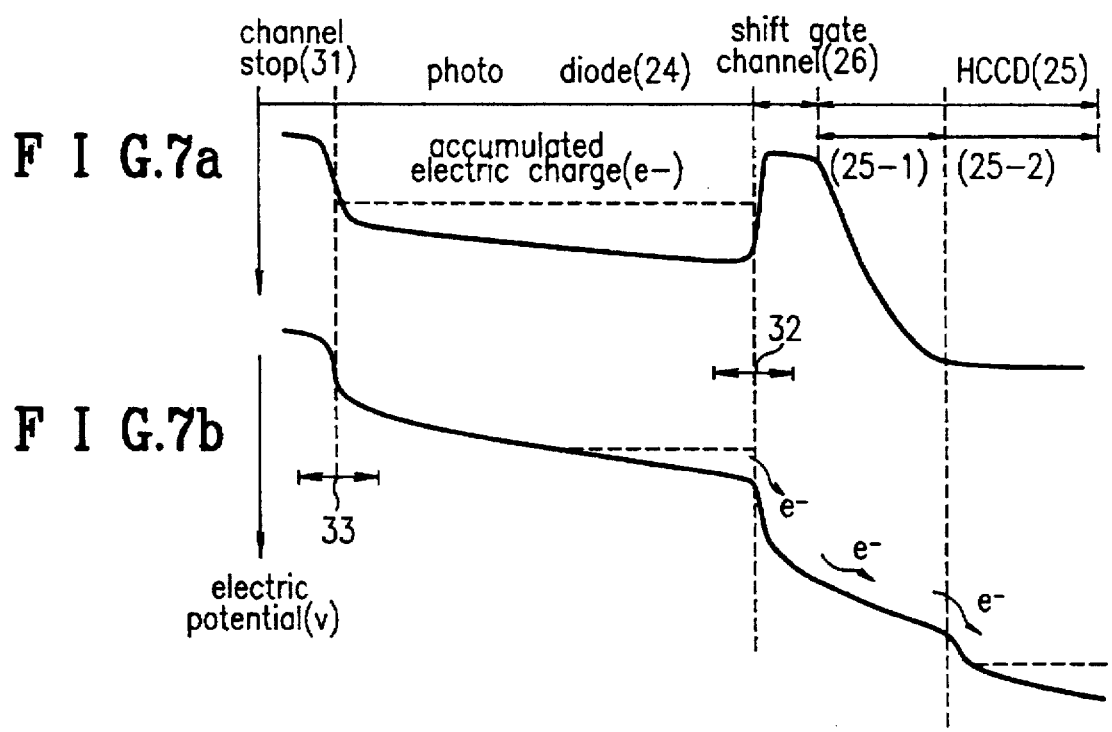

LINEAR SOLID STATE IMAGING DEVICE WITH TRAPIZOID TYPE PHOTODIODES

CROSS-REFERENCE TO RELATED APPLICATION

This is a continuation of application Ser. No. 08/214,960, filed Mar. 17, 1994, now abandoned.

FIELD OF THE INVENTION

This invention relates to a solid state imaging device, and more particularly, to a solid state imaging device which has a photodiode of a small width and long length and is used as an imaging unit for the facsimile machine.

BACKGROUND OF THE INVENTION

A linear charge coupled device (CCD) solid state imaging device is used as an imaging unit for a facsimile machine, a bar code reader or the like. A solid state imaging device having dual CCD channels includes a linearly-arranged photodiode array and a horizontal charge coupled device (HCCD) disposed along both sides of the photodiode array. Signal charges generated in the individual photodiodes are periodically transferred into either of two parallel HCCDs and they are shifted in series format to the output amplifier.

FIG. 1 is a plan view representing a conventional imaging device, and FIG. 2 is a sectional view taken along line A—A' of FIG. 1.

Referring to these two figures, a conventional linear imaging device includes an n-type substrate 11, a first p-type well 12 formed in one surface portion of the substrate, a second p-type well 13 formed deeper than the first p-type well and in another surface portion of the substrate, an n$^-$type impurity area or photodiode area 14 having a rectangular shape having a small width and long length in the first well 12 for forming the photodiode for accumulating the charges generated by an incident light, a p$^{++}$type impurity area 17 formed near the top surface of the photodiode area 14 so as to form a potential barrier, an n$^-$type impurity area or HCCD area 15 in the second well 13 for forming a pair of HCCDs by which the transferred charges from the photodiode 14 are output to the output amplifier (not shown), a shift gate channel area 16 formed in the first p-type well 12 and between the areas for the photodiode 14 and the HCCD 15, a poly gate 19 disposed on the shift gate channel area 16 and HCCD area 15, a shift gate 18 which is overlapped with each of the poly gates 19 and is formed in the shift gate channel area 16 in order to transfer the charges generated from the photodiode 14 into the HCCD 15, and a channel stop area 10 for isolating the cells from each other by means of a barrier.

The shift gate 18 and each of the poly gate arrays are substantially a layer of doped polysilicon.

Through the shift gate channel area 16, the transferred charges from the photodiode area 14 to the HCCD area 15 are transported to the output amplifier by means of the poly gate 19 which includes a first poly gate electrode 19-1 overlapped with the shift gate 18 and a second poly gate electrode 19-1 partially overlapped with the first poly gate electrode 19-2, wherein the first and second gates are alternatively arranged over the HCCD area 15. Such a configured imaging device is operated at an accumulation mode and a transfer mode.

FIGS. 3A and 3B show the maximum potential distribution in the respective areas of the imaging device as shown in FIG. 2

FIGS. 3A and 3B represent the maximum potential distribution in the accumulation mode and transfer mode, respectively.

When the lowest voltage of 0 V is applied to the shift gate 18 and first poly gate 19-1 and the highest voltage of 15 V applied to the HCCD 15 through a reset drain terminal RD, the respective areas in the imaging device have the maximum potential distribution as shown in FIG. 3A.

Since, in an accumulation mode, a high potential barrier is formed by the p$^{30}$ $^+$type channel stop area 10 and p-type shift gate channel area 16, the charges generated in the photodiode 14 by the incident light are accumulated in the photodiode.

Meanwhile, when the high voltage in the range of 10 V to 15 V is applied to the shift gate 18 and first poly gate 19-1 and the highest voltage of 15 V is applied to HCCD 15 through the reset drain terminal RD, the respective areas in the imaging device have the maximum potential distribution as shown in FIG. 3B. Therefore, the potential barrier of the shift gate area 16 in the transfer mode is lowered as shown in FIG. 3B, thereby transferring the accumulated charges in each of the photodiodes 14 to HCCD 15 through the shift gate channel area 16, in parallel fashion.

The charges in HCCD 15 are output in series to the output amplifier (not shown) by applying appropriate signal to the first poly gate electrode 19-1 and second gate electrode 19-2.

Referring to FIG. 1, the conventional imaging device, however, has the photodiode array, each of which is in the rectangular form having a small width and long length, and underneath the shift gate 18 the shift gate channel area 16 having a smaller width than that of the photodiode 14 and having a generally rectangular shape.

The channel width effect is exhibited in an area 9 existing between the area of the photodiode 14 and the shift gate channel area 16 as the passageway for transferring the accumulated charges in the photodiode 14 into the HCCD 15, which effect causes the potential barrier to form, thereby undesirably reducing the transfer efficiency.

The reason why the potential barrier is formed is because the impurity concentration of p$^{++}$type channel stop area 10 results in a higher potential level in the area 9 than in other portions of the photodiode formation area in an approximate difference, whereby the area 9 exists between the areas of the photodiode 14 and the shift gate channel 16 than the potential level in other portions of the photodiode formation area. Thus, when the accumulated charges in the photodiode 14 are transferred to HCCD 15 according to the transfer mode, the formed potential barrier makes some fraction of charges left to lower the voltage saturation level of the imaging device. Further, the photodiode area 14 is spaced apart from HCCD area 15 by a long channel length of the shift gate channel area 16, which affects the charge transfer.

The computer simulation result is plotted in FIG. 4 associated with the potential distribution of the imaging device as shown in FIG. 2. It is seen from that figure that the potential barrier is formed due to the higher potential level in the area 9 than in other portions of the photodiode area 14 as described above.

SUMMARY OF THE INVENTION

It is an object of the invention to provide a linear solid state imaging device whose charge transfer efficiency is markedly improved by adopting a trapezoid-type photodiode area, the opposite sides of which have the different widths from each other and a HCCD area extending to near the photodiode area.

A linear solid state imaging device of this invention comprises a first conductivity type silicon substrate, a first well of a second conductivity type which is formed in one surface portion of the substrate and has a predetermined junction depth, a second p-type well of a second conductivity type which is formed in deeper junction depth than that of the first p-type well and in another surface portion of the substrate, a plurality of trapezoid-type photodiode areas of the first conductivity type for generating the signal charges, wherein the trapezoid type area is arranged in the first well except for one side of the parallel sides of the trapezoid area, other sides are surrounded by the channel stop area, a pair of HCCD areas of the first conductivity type formed in the second well, a plurality of shift gate channel areas of the second conductivity type formed in the first well underneath the shift gate and having a six-sided shape one side of which is in contact with the photodiode area and another side of which has a V-shaped depression and other sides are surrounded by the channel stop area, a plurality of potential barrier formation areas formed near the top surface of the photodiode arch, a poly gate disposed over the substrate in which the HCCD area is formed, in order that the transferred charges from the photodiode are output to the output amplifier, an insulating layer formed between the shift gate and the poly gate providing insulation therebetween, and a channel stop area of the second conductivity type for isolating the photodiode cells from each other by means of a potential barrier.

BRIEF DESCRIPTION OF THE DRAWINGS

FIG. 2 is a sectional view taken along line A–A' of FIG. 1;

FIGS. 3A and 3B show the maximum potential distribution in the respective areas of the imaging device as shown in FIG. 2;

FIG. 6 is a sectional view of the solid state imaging device taken along line B—B' of FIG. 5;

FIGS. 7A and 7B show the maximum potential distribution in the respective areas of the imaging device as shown in FIG. 6;

DETAILED DESCRIPTION OF THE INVENTION

Figure 5:
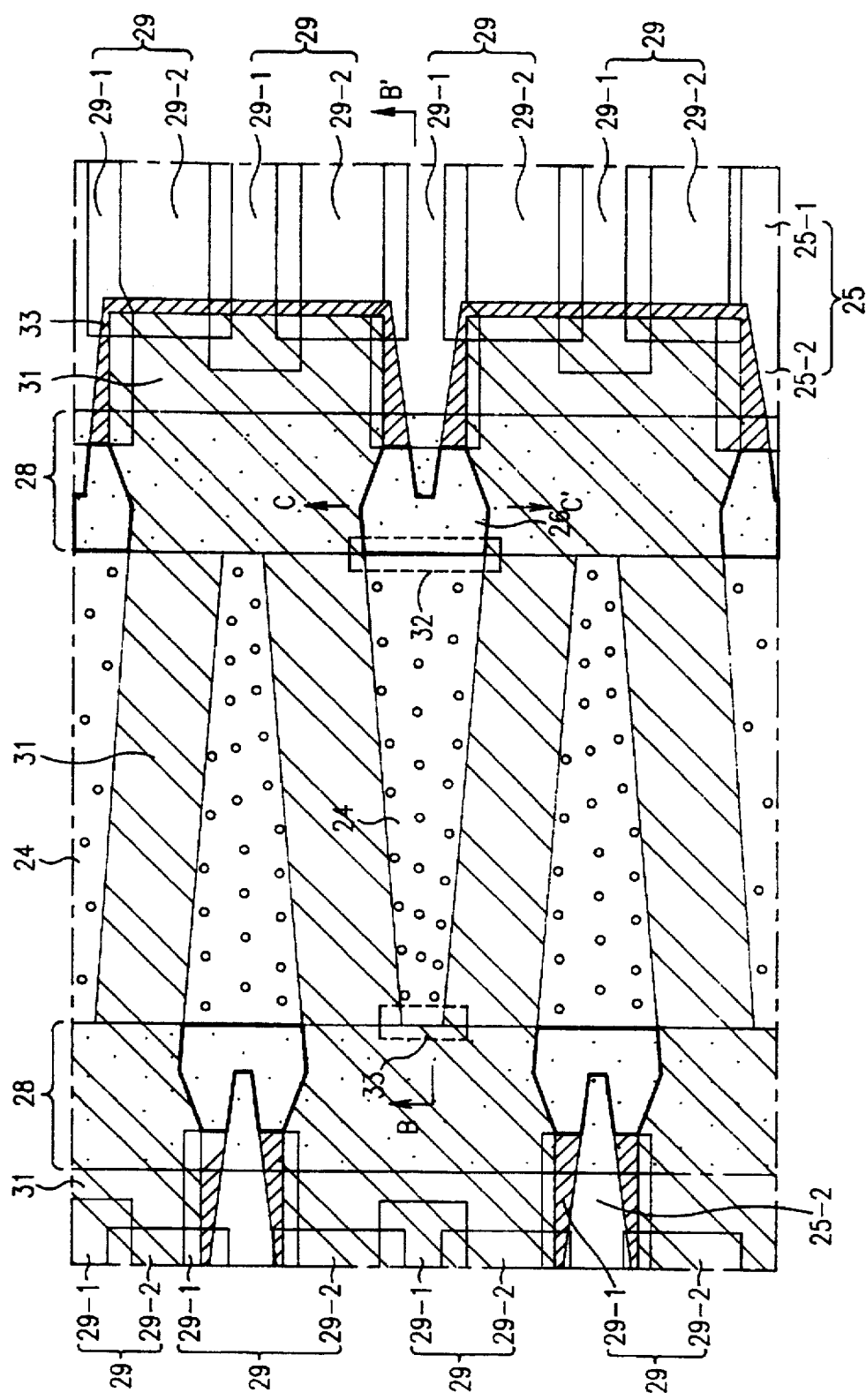
FIG. 5 is a plan view of a linear solid state imaging device according to one embodiment of the present invention.
Figure 9:
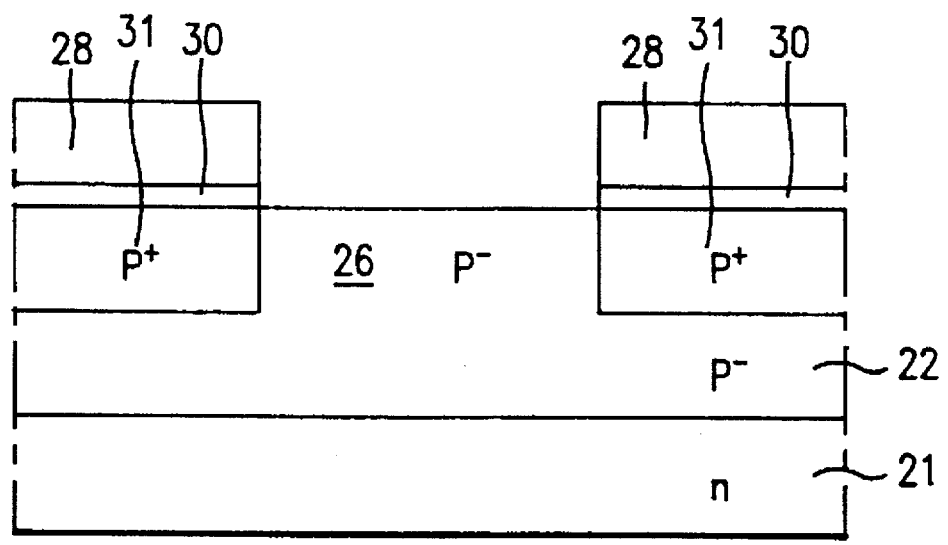
FIG. 9 is a sectional view of the solid state imaging device taken along line C—C' of FIG. 5.

FIG. 5 is a plan view of a linear solid state imaging device according to an embodiment of the present invention. FIG. 6 is a sectional view taken along line B—B' of FIG. 5. FIG. 9 is a sectional view taken along the line C—C' of FIG. 5.

Referring to FIGS. 5 and 6, a linear solid state imaging device of this invention comprises an n-type substrate 21, a first p-type well 22 formed in one surface portion of the substrate 21, a second p-type well 23 formed in deeper junction depth than that of the first p-type well 22 and in another surface portion of the substrate 21, a plurality of n⁻type photodiode areas 24 for generating the signal charges formed in the first well 22, and n⁻type HCCD area 25 formed in the second well 23 which is in areas of both sides of the photodiode area 24 in order that the transferred charges from the photodiode area 24 are output to the output amplifier (not shown), a shift gate 28 formed over the substrate between the areas for the photodiode 24 and HCCD 25 and for transferring the accumulated charges in the photodiode area 24 to the HCCD area 25, a plurality of shift gate channel areas 26 of a six-sided polygon which are formed underneath the shift gate 28 and in the first well 22 between the areas for the photodiode and HCCD, a potential barrier formation p⁺⁺type area 27 which is formed near the top surface of the photodiode area 24, a plurality of poly gates 29 disposed over the substrate in which the HCCD area is formed, in order that the transferred charges from the photodiode area 24 are output to the output amplifier (not shown), an insulating layer 30 formed over the substrate area between the shift gate 28 and the poly gate 29 for providing insulation therebetween and formed on the substrate 21, and a channel stop area 31 for isolating the cells from each other by means of a potential barrier.

Each area of photodiodes 24 which are linearly arranged is a trapezoid type area one side of which is in contact with the shift gate channel area 26 and has a larger width than that of the opposite side. In each area of photodiodes 24, the one side is in contact with the shift gate channel area 26 and other three sides are surrounded by the channel stop area 31.

Each of the shift gate channel areas 26 underneath the shift gate 28 between the photodiode area 24 and the poly gate electrode 29 has a six-sided shape having a V-shaped depression. One side of the shift gate channel areas 26 is in contact with the one side of the photodiode area 24 in the same width from each other and other sides are surrounded by the channel area.

Figure 1:
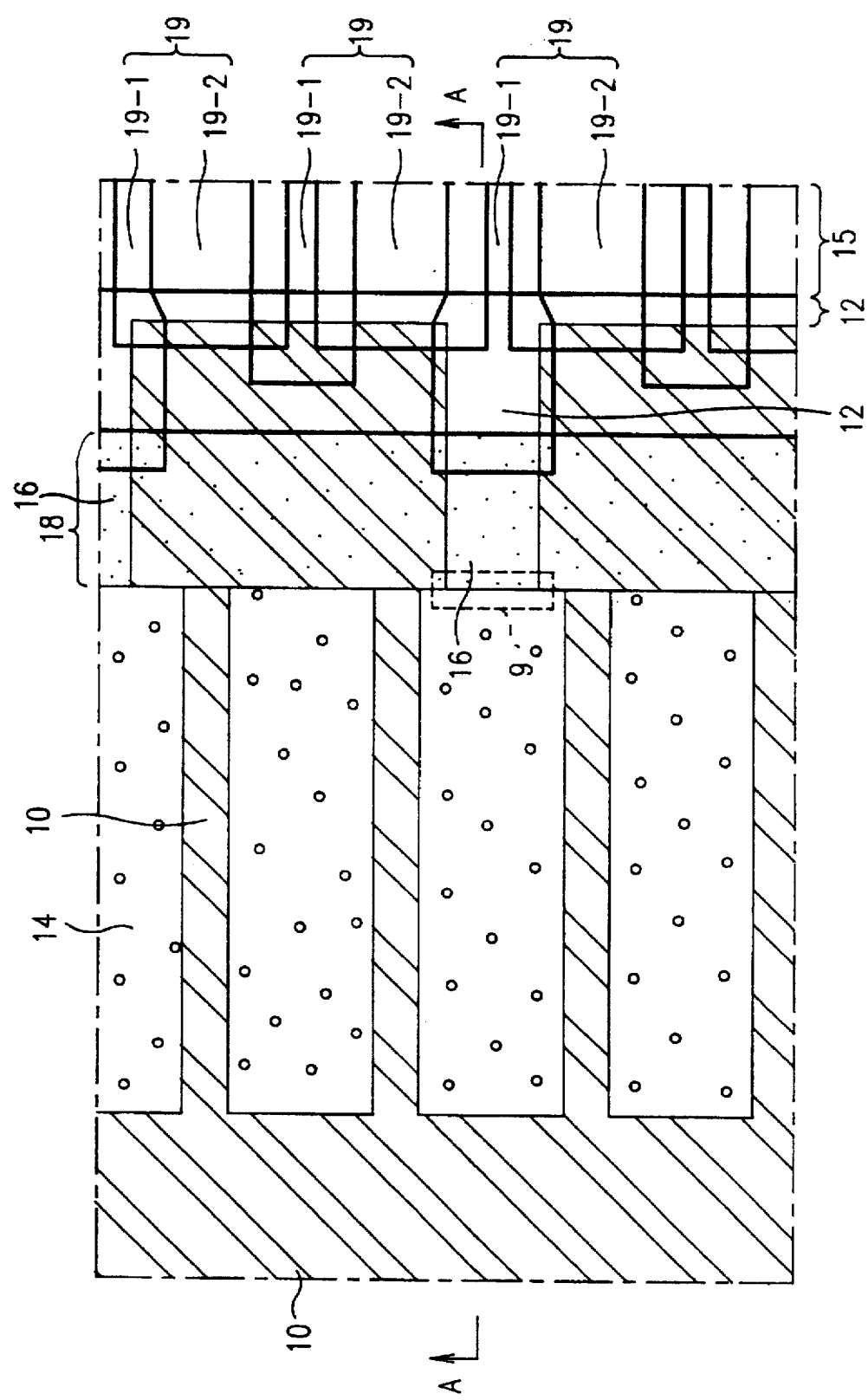
FIG. 1 is a plan view representing a conventional imaging device.
Figure 4:
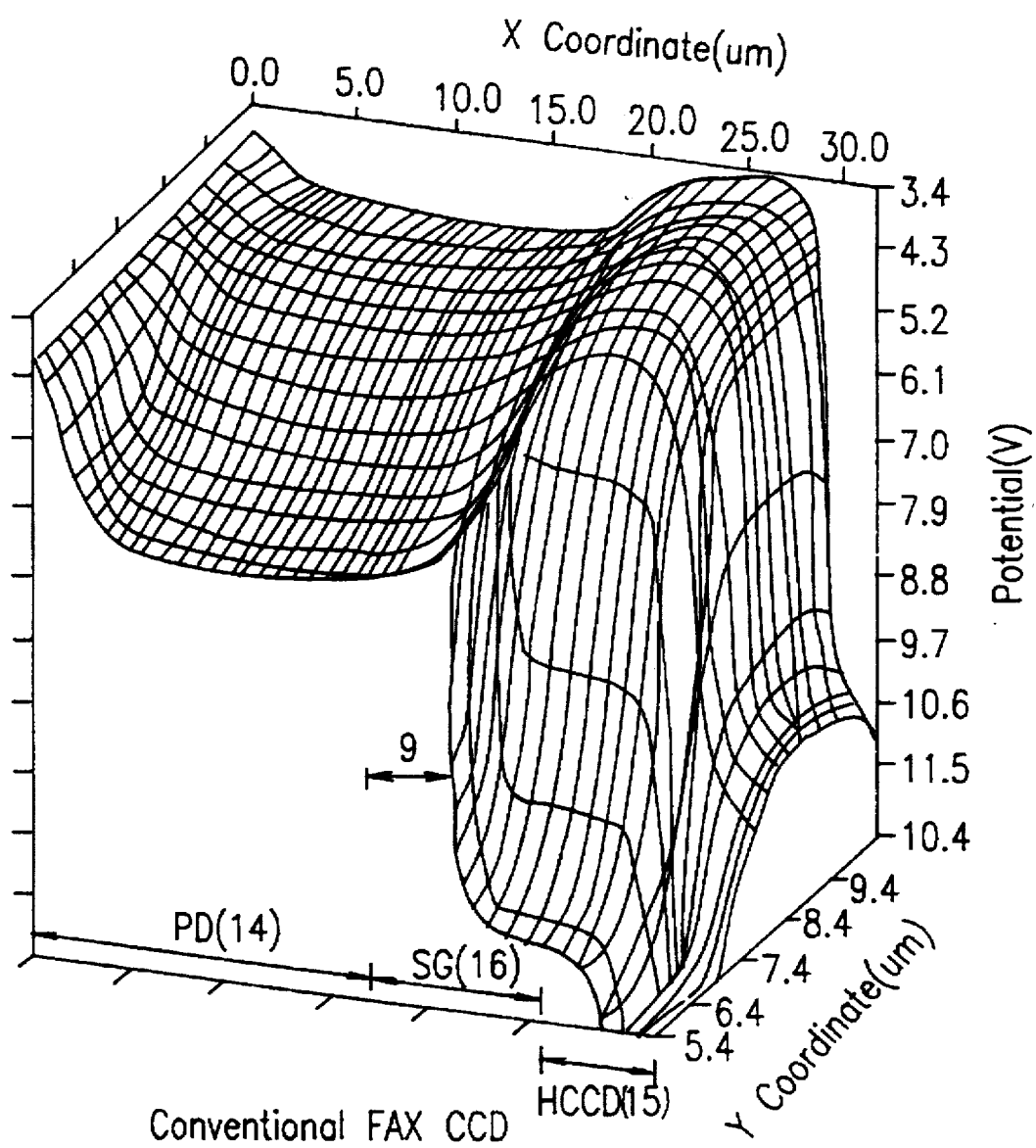
FIG. 4 shows the computer simulation result associated with the potential distribution of the imaging device as shown in FIG. 3.

The respective HCCD area 25 is so arranged as to be disposed at both sides of the photodiode area 24, with the photodiode array in the center. HCCD area 25 may be rectangular form of which one side extends in the parallel direction with the photodiode array, as shown in FIGS. 1 and 2; alternatively, it may be configured in such a manner that a main HCCD area 25-1 in the second well 23 is of the shape extending in the parallel direction with the photodiode and protrusion areas 25-2 is in the shape of the trapezoid extending to the V-shaped depression of shift gate channel area 26 underneath the shift gate 28, as shown in FIGS. 5 and 6.

Each of the poly gates 29 consists of a first poly gate electrode 29-1 formed over the surface of the substrate in which the protrusion area 25-2 of the HCCD area 25 is formed, and a second poly gate electrode 29-2 formed over the surface of the substrate in which the main HCCD area 25-1 of HCCD area 25 is formed.

There are provided a plurality of the first and second poly gates 29-1, 29-2 of which first and second gates are alternatively arranged in sequence, whereby the first poly gates 29-1 are partially overlapped with the second poly gate electrodes and vice versa. The protrusion area 25-2 of the HCCD area 25 has a smaller width than the first poly gate electrode 29-1 and is extended to the V-shaped depression.

The imaging device of this invention has the trapezoid type photodiode area 24 where the one side, which is contact with the one side of the shift gate channel region 26 in the same width from each other in the portion 33, has a larger width than the opposite side so that the charges are generated in the photodiode area and then accumulated in the photodiode area adjacent the shift gate channel area as shown in FIG. 7A.

FIGS. 7A and 7B represent the maximum potential distribution in the accumulation mode and transfer mode, respectively, associated with the solid state imaging device of FIG. 6.

When the lowest voltage of 0 V is applied to the shift gate 28 and first poly gate 29-1 and the highest voltage of 15 V applied to HCCD 25 through a reset drain terminal RD, the respective areas in the imaging device have the potential distribution as shown in FIG. 7A. Since a high potential barrier is formed by the channel stop area 31 and the shift gate channel area 26, the charges generated in the photodiode 24 by the incident light accumulate in the photodiode, without being transferred into HCCD 25 by the formed potential barrier.

Meanwhile, when the high voltage in the range of 12 V to 15 V is applied to the shift gate 28 and first poly gate 29-1 and the highest voltage of 15 V applied to HCCD 25 through a reset drain terminal RD, a PN junction formed by p-type shift gate channel area 26 and n-type HCCD 25 becomes the reverse-biased condition, to leave fully depleted state. That is, the highest voltage applied through the reset drain terminal RD results in the reverse-biased state causing to be fully depleted state.

Accordingly, as seen from the potential distribution of FIG. 7B, the charges remain accumulated in a deep portion of HCCD area at which the maximum potential or pinch off voltage takes place. That is, the charges stored in the photodiode area of the formed maximum voltage in an accumulation mode can be transferred to the transfer mode to the HCCD area of the formed maximum voltage, whereby the wider and higher the width and concentration of those areas are, the higher the level of the maximum voltage is, when both the photodiode and HCCD areas are n-type.

According to the present invention utilizing the effects exhibited by the width, the imaging device of this invention, as shown in FIG. 7B, has a graded potential distribution due to the reason why the width and maximum voltage of the area 32 of the photodiode is wider and higher than in the area 33 and the level of the maximum voltage is more and more larger through the excursion from the main HCCD area 25-1 to the protrusion area 25-2. Therefore, a potential barrier like the conventional art in the area 32 existing between the photodiode area 24 and the shift gate channel area 26 in the transfer mode is not formed, but rather a graded potential distribution is formed.

According to the invention, the transfer mode, the accumulated charges in the photodiode area 24 can be fully transferred to HCCD area 25.

Figure 8:
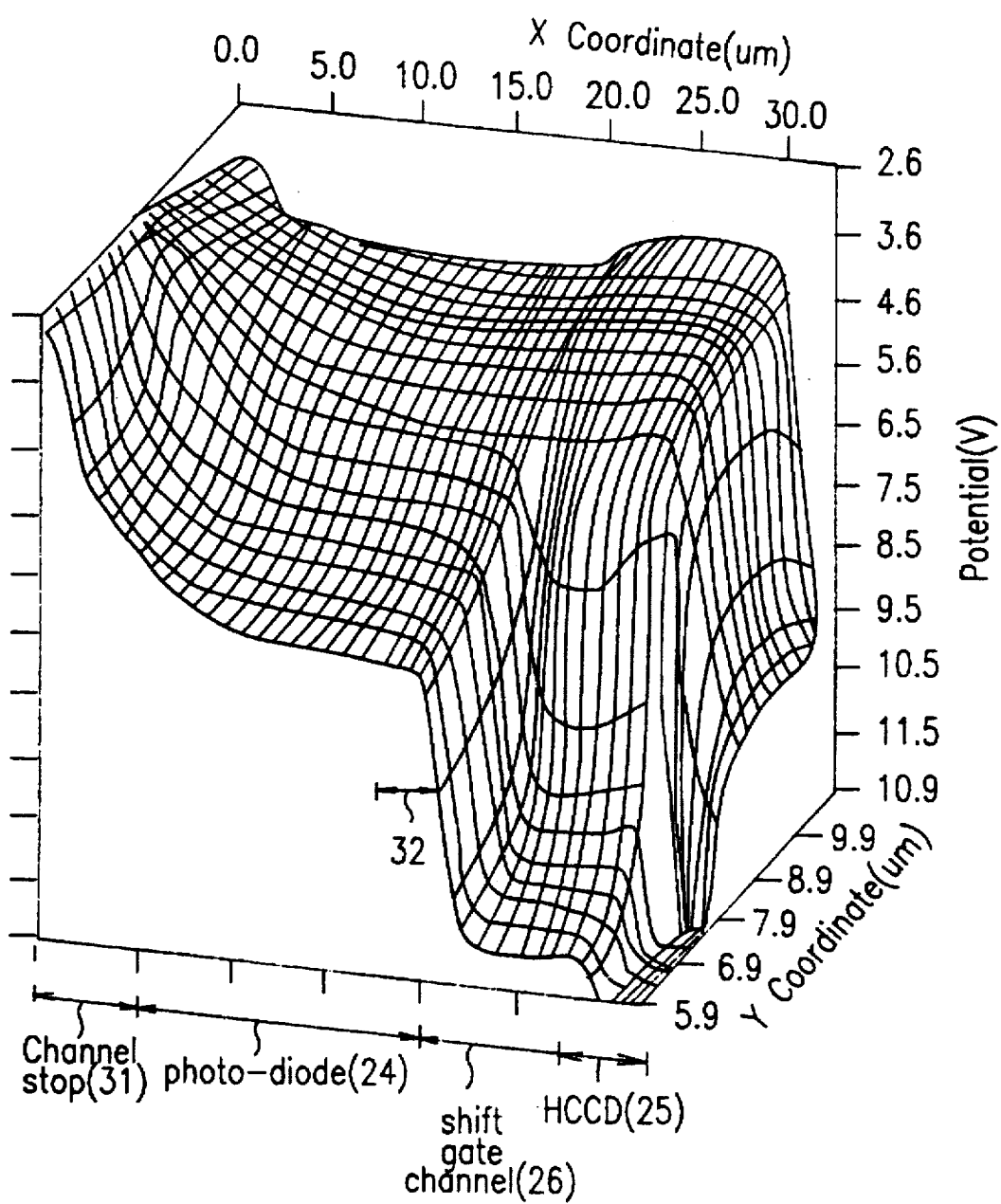
FIG. 8 shows the computer simulation results associated with the maximum potential distribution of FIG. 7B.

The computer simulation result is plotted in FIG. 8 associated with the maximum potential distribution of FIG. 7B, and it is seen from that figure that the graded potential distribution is formed as described above. Since the graded potential distribution can be obtained in the photodiode area and HCCD areas the transfer efficiency is improved and can be constantly maintained even in case of a higher clock frequency applied to the first and second poly gate electrodes.

What is claimed is:

1. A linear solid image device, comprising:
   a first conductivity type silicon substrate;
   a first well of a second conductivity type, formed in one surface portion of the substrate and having a predetermined junction depth;
   a second well of the second conductivity type, and formed in deeper junction depth than that of the first well and in another surface portion of the substrate;
   a channel stop area of the second conductivity type for isolating photodiode cells from each other by means of a potential barrier;
   a plurality of trapezoid type photodiode areas for generating signal charges, wherein one of the plurality of trapezoid type photodiode areas is arranged in the first well and except for one side of parallel sides of the trapezoid type photodiode area, other sides are surrounded by the channel stop area;
   a pair of horizontal charge coupled device (HCCD) areas of the first conductivity type in the second well extended to a portion of the first well;
   a shift gate formed over the substrate between a photodiode area and an HCCD area and for transferring accumulated charges in the photodiode area to the HCCD area;
   a plurality of shift gate channel areas of the second conductivity type formed in the first well underneath the shin gate and having a six-sided shape one side of which is in contact with the photodiode area, another side of which has a V-shaped depression and other sides of which are surrounded by the channel stop area;
   a plurality of potential barrier formation areas formed proximate a top surface of the photodiode area;
   a poly gate disposed over the substrate in which the HCCD area is formed; and
   an insulating layer formed between the shift gate and the poly gate and providing insulation therebetween.

2. A device of claim 1, wherein one side of the photodiode area which is not surrounded by the channel stop area is in contact with the shift gate channel area and has a larger width than that of an opposite side of the photodiode area.

3. A device of claim 1, wherein the HCCD area has a rectangular configuration extending parallel to the photodiode areas.

4. A device of claim 2, wherein the one side of the shift gate channel area which is in contact with the photodiode area has the same width as the photodiode area and the opposite side has a smaller width than that of the poly gate.

5. A device of claim 2, wherein the shift gate overlaps with a portion of the poly gate.

6. A device of claim 2, wherein the poly gate is formed over the second well and extended to a portion of the first well.

7. A linear solid state imaging device, comprising:
   a first conductivity type silicon substrate;
   a first well of a second conductivity type, formed in one surface portion of the substrate and having a predetermined junction depth;
   a second well of a second conductivity type and formed in deeper junction depth than that of the first well and in another surface portion of the substrate;
   a channel stop area of the second conductivity type for isolating photodiode cells from each other by means of a potential barrier;
   a plurality of trapezoid-type photodiode areas for generating signal charges, wherein the trapezoid type areas are linearly arranged in the first well and except for one side of parallel sides of the trapezoid area, other sides are surrounded by the channel stop area;
   a pair of horizontal charge coupled device (HCCD) areas of the first conductivity type formed in the second well and having a main HCCD area in a rectangular shape and protrusion areas;
   a shift gate formed over the substrate between the photodiode areas and the HCCD areas and for transferring the accumulated charges in the photodiode areas to the HCCD areas;

a plurality of shift gate channel areas of the second conductivity type formed in the first well underneath the shift gate and having a six-sided shape one side of which is in contact with a photodiode area, another side of which has a V-shaped depression and other sides of which are surrounded by the channel stop area;

a plurality of potential barrier formation areas formed proximate a top surface of the photodiode areas;

a poly gate disposed over the substrate in which HCCD areas are formed and for transferring charges from the photodiode areas; and an insulating layer formed between the shift gate and the poly gate and providing insulation therebetween.

8. A device of claim 7, wherein the main HCCD area has a shape extending parallel to the photodiode area and one of the protrusion areas is in the shape extending to the V-shaped depression from the main HCCD area.

9. A device of claim 8, wherein one of the protrusion areas has one side in the vicinity of the shift gate and another side of a smaller width than that of the one side and in vicinity of the main HCCD area.

10. A device of claim 8, wherein each of the protrusion areas has trapezoid type shape.

11. A device of claim 7, wherein the one side of the shift gate channel area which is in contact with the photodiode area has the same width and the opposite side has a smaller width than that of the poly gate.

12. A device of claim 7, wherein the poly gate comprises a first poly gate electrode formed over the surface of the substrate in which the protrusion area is formed; and further comprising a second poly gate electrode formed over the surface of the substrate in which the main HCCD area is formed.

* * * * *

UNITED STATES PATENT AND TRADEMARK OFFICE
CERTIFICATE OF CORRECTION

PATENT NO. : 5,675,158
DATED : October 7, 1997
INVENTOR(S) : Lee

It is certified that error appears in the above-identified patent and that said Letters Patent is hereby corrected as shown below:

Column 6, line 18, change "shin gate" to --shift gate--;

line 35, change "claim 2" to --claim 1--;

line 38, change "claim 2" to --claim 1--;

line 41, change "claim 2" to --claim 1--.

Signed and Sealed this

Fifth Day of January, 1999

Attest:

Attesting Officer

*Acting Commissioner of Patents and Trademarks*